(12) United States Patent
Staley

(10) Patent No.: US 6,882,735 B2
(45) Date of Patent: Apr. 19, 2005

(54) DYNAMIC RANGE COMPRESSION OF AN AUDIO SIGNAL

(75) Inventor: Clinton A. Staley, Atascadero, CA (US)

(73) Assignee: Autodesk, Inc., San Rafael, CA (US)

( * ) Notice: Subject to any disclaimer, the term of this patent is extended or adjusted under 35 U.S.C. 154(b) by 841 days.

(21) Appl. No.: 09/758,679

(22) Filed: Jan. 11, 2001

(65) Prior Publication Data

US 2002/0126860 A1 Sep. 12, 2002

(51) Int. Cl.[7] .................................................. H03G 7/00
(52) U.S. Cl. ........................................ 381/106; 381/107
(58) Field of Search ................................ 381/106, 107, 381/108, 109, 104, 94.1; 700/94

(56) References Cited

U.S. PATENT DOCUMENTS

| | | | |
|---|---|---|---|
| 4,071,695 A | 1/1978 | Flanagan et al. | 179/1 VL |
| 4,093,831 A | 6/1978 | Sharp et al. | 179/100.1 VC |
| 4,398,061 A | 8/1983 | McMann, Jr. | 179/1 VL |
| 4,562,591 A | 12/1985 | Stikvoort | 381/106 |
| 4,661,981 A | 4/1987 | Henrickson et al. | 381/31 |
| 4,696,040 A | 9/1987 | Doddington et al. | 381/46 |
| 4,864,627 A | 9/1989 | Dugan | 381/108 |
| 4,935,963 A | 6/1990 | Jain | 381/31 |
| 5,278,912 A | 1/1994 | Waldhauer | 381/68.4 |
| 5,488,668 A | 1/1996 | Waldhauer | 381/68.4 |
| 5,706,357 A | 1/1998 | Yang | 381/107 |
| 5,784,476 A * | 7/1998 | Bird | 381/106 |
| 5,822,018 A | 10/1998 | Farmer | 348/705 |
| 5,828,755 A | 10/1998 | Feremans et al. | 381/61 |
| 5,832,444 A | 11/1998 | Schmidt | 704/500 |
| 5,892,834 A * | 4/1999 | Smart et al. | 381/106 |
| 5,896,458 A | 4/1999 | Werrbach | 381/108 |
| 5,923,767 A * | 7/1999 | Frindle et al. | 381/106 |
| 5,923,768 A * | 7/1999 | Frindle et al. | 381/106 |
| 6,088,461 A * | 7/2000 | Lin et al. | 381/107 |
| 6,107,879 A * | 8/2000 | Hoshino et al. | 381/106 |
| 6,473,662 B1 * | 10/2002 | Lubbe et al. | 381/106 |

OTHER PUBLICATIONS

Cormen, *Introduction to Algorithms*, ISBN 0–07–013143–0, pp. 898–907.

* cited by examiner

*Primary Examiner*—Stella Woo
(74) *Attorney, Agent, or Firm*—Gates & Cooper LLP

(57) ABSTRACT

Computer processor method and apparatus for creating an audio multiplier control signal for controlling the dynamic range of a recorded audio work. The technique includes determining an envelope of the amplitude of amplitude versus time values the audio signal, and then determining, for values of the envelope, respective minimum and maximum multiplication factors (MinMF and MaxMF) that can be multiplied times the values such that the products are above a predetermined minimum amplitude and below a predetermined maximum amplitude of the dynamic range. Then a control signal function of amplitude versus time is created such that all values of the control signal function at particular times are between respective MinMF and MaxMF values for the times, and such that segments of the control signal function have reduced slopes. Also disclosed is a method of creating a reduced-slope series of line segments passing through a pair of Max and Min limiting functions specifying y values with respect to a variable x.

41 Claims, 2 Drawing Sheets

DYNAMIC RANGE COMPRESSION OF AN AUDIO SIGNAL

BACKGROUND OF THE INVENTION

The invention relates to dynamic range compression of audio signals.

Dynamic range compression reduces the level differences between the high and low intensity portions of an audio signal. It is used to preprocess signals for codecs or other audio filters that benefit from a limited dynamic range, in particular filters that reduce the number of bits of audio data per sample.

SUMMARY OF THE INVENTION

In one aspect, the invention features, in general, creating an audio multiplier control signal for controlling the dynamic range of a recorded audio work. The technique includes determining an envelope of the amplitude of amplitude versus time values of the audio signal, and then determining, for values of the envelope, respective minimum and maximum multiplication factors (MinMF and MaxMF) that can be multiplied times the values such that the products are above a predetermined minimum amplitude and below a predetermined maximum amplitude of the dynamic range. Then a control signal function of amplitude versus time is created such that all values of the control signal function at particular times are between respective MinMF and MaxMF values, and such that segments of the control signal function have reduced slopes.

Preferred embodiments of the invention may include one or more of the following features. The audio signals are digital audio samples. Amplitude values below a minimum threshold value are taken as the minimum threshold value in the determining the envelope.

The envelope determination can be applied to the absolute values of the amplitude of the audio signal. A convex hull calculation is used to determine the envelope. The convex hull calculation can involve traversing the amplitude versus time values with a moving range of data points. The moving range is greater than or equal to the longest wavelength of the audio signals, e.g., the range can be 1500 samples or greater for a signal having a sampling rate of 44 KHz and a longest wavelength of 1/30 second. Data points on the trailing side of the range are dropped as the trailing edge of the range traverses the data points. Data points within the range are popped as they fall below the envelope being extended to data points at the leading edge of the range. The determination of the envelope of the amplitude of the audio signal has an order of complexity of O(n), where n is the number of audio signal values. The amplitude value for the audio signal is examined at most a fixed number of times in the determination of the envelope of the amplitude of the audio signal.

The control signal function generation includes using a first convex hull calculation for the MinMF values and a second convex hull calculation for the MaxMF values to identify line segments of the control signal function that are between the MinMF and MaxMF values and have reduced slope. The first convex hull calculation results in a low hull, and the second convex hull calculation results in a high hull, and a segment of the control signal function is determined each time that the low hull and high hull cross. The MinMF and MaxMF values are converted to logarithms prior to using the first and second convex hull calculations. Logarithms of the MinMF values and the MaxMF values are used to generate segments of a logarithm of the control signal function such that values of the logarithm of the control signal function are between the logarithm of MinMF and logarithm of MaxMF values, and such that segments of the logarithm of the control signal function have reduced slopes. The envelope has vertices, and the creation of a control signal function has an order of complexity of O(n), where n is the number of envelope vertices. Each vertex is examined at most a fixed number of times in the creating a control signal function.

In other aspects, the invention features, in general, using the control signal generated as just described to adjust audio signals, and apparatus creating and applying the control signal to adjust audio signals.

In another aspect, the invention features, in general, creating a reduced-slope series of line segments passing through a pair of Max and Min limiting functions specifying y values with respect to a variable x. First, the Max and Min limiting functions are defined. Then a first convex hull calculation is used for y values of the Min limiting function and a second convex hull calculation is used for y values of the Max limiting function to identify line segments that are between the Min and Max values and have reduced slope.

Embodiments of the invention may include one or more of the following advantages. Audio samples are dynamically range compressed to values within a permitted dynamic range by gradual adjustments to the gain applied to the signal. Geometric adjustments are used to avoid adjustments that are perceptible to the listener. The adjustments have a linear complexity; that is, each audio data point is at most examined a fixed number of times regardless of the size of the audio file. Adjustments are as slow as possible consistent with guaranteeing that audio samples fall within the permitted dynamic range.

Other advantages and features of invention will be apparent from the following description of a preferred embodiment thereof and from the claims.

DETAILED DESCRIPTION OF EMBODIMENT

Figure 1:
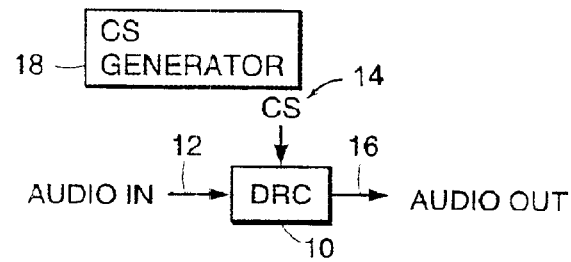
FIG. 1 is a block diagram of a dynamic range compression device.

Referring to FIG. 1, dynamic range compression unit 10 (which can be implemented in software or hardware) receives audio input 12 and applies a gain to it according to control signal (Cs) 14 in adjusting the audio output 16, which has minimum and maximum permitted amplitude values within a desired range. The control signal generated by Cs generator 18 provides gradual adjustments to the volume in advance of loud or quiet portions of the signal to bring the maximum and minimum volumes into range without noticeable adjustments.

Generator 18 employs a three-step procedure in order to provide gradual adjustments in generating the Cs values.

Figure 2:
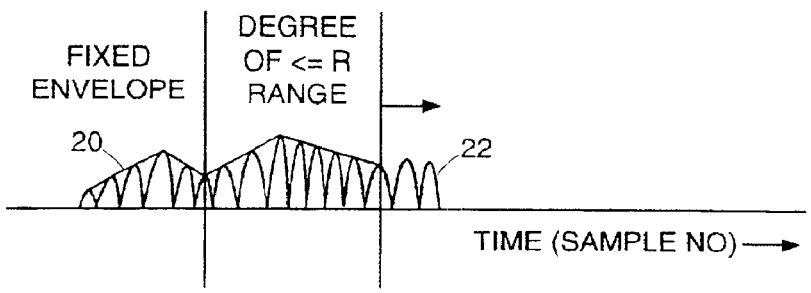
FIG. 2 is a graph of amplitude vs. time showing an audio signal and an envelope for the audio signal.

First a signal envelope 20 is created for the absolute values 22 of the input audio signal, as shown in FIG. 2. The envelope is used to prevent wave troughs in the signal from being interpreted as quiet portions requiring amplification to stay within the specified dynamic range.

Next there is calculated, for each point on the envelope, a minimum and maximum multiplication factor (MinMF and MaxMF) that can be multiplied times the envelope value such that the product is above a predetermined minimum amplitude and below a predetermined maximum amplitude of the dynamic range. These MinMF and MaxMF values are shown plotted on FIG. 3, and it is seen that they form a "VMR tunnel 24" (explained below) between them.

The last step is generation of a control signal Cs function 26 (FIG. 3) such that the values of Cs are within the tunnel 24, and the Cs function has small slopes, given the constraints of the tunnel. Keeping the Cs values within the MinMF/MaxMF tunnel guarantees that no audio sample is outside of the permitted dynamic range. Keeping the slopes small provides for gradual adjustments.

These steps of generating the Cs values are described in detail below.

Envelope Calculation

Referring to FIGS. 1 and 2, generator 18 (which is implemented in software) first computes the envelope 20 of the signal, by taking the absolute value of each audio point of the input signal and using a modified Graham's scan convex-hull algorithm (see Cormen, Introduction to Algorithms, ISBN 0-07-013143-0, pp. 898–905) to generate a "convex hull" across the top of the absolute values 22. Graham's algorithm is typically used to create a convex hull for a set of two-dimensional coordinates. The algorithm considers each point in the set in sequence as a potential member of the set of points on the convex hull, and "pops" (i.e., removes) a point from the convex hull when it appears that including it will result in a concave portion on the convex hull. Each point is considered in rotational order with respect to a starting point.

In computing envelope 20 for the audio samples, the typical Graham algorithm is modified by visiting points in left-to-right order instead of rotational order, and by using a moving set containing a fixed number of audio sample points that traverses the entire audio program instead of considering the entirety of the set of points at one time. The moving set is held in a so-called "deque" (a queue that can be added to or deleted from on either end). The size R of the moving set (in number of samples) should be greater than or equal to half the longest wavelength to avoid interpreting the rise and fall of sinusoids as volume peaks to be damped. E.g., R could be 750 samples (or greater), given a longest wavelength of 1/30 second and a sampling rate of 44 KHz.

Referring to FIG. 2, the current envelope generation procedure maintains a set of "potential envelope points," composed either of actual audio samples, or of "generated envelope points" as described below. At any point in the process (after initialization), a deque Q has a set of up to R potential envelope points spanning exactly R samples. As the hull computation advances rightward to each successive sample S, generator 18 drops off the left end of Q any samples that are not from the R prior samples. Samples that are so dropped are considered a permanent part of the envelope.

The rightmost potential envelope point, at sample T, is always an actual audio sample. The leftmost potential envelope point, at T-R+1, may be an actual audio sample. However, the actual audio sample at T-R+1 may have been removed from Q earlier to eliminate a concavity. In this event, generator 18 maintains at T-R+1 a generated envelope point derived by interpolating linearly between the closest audio samples that still remain on the envelope. There are always potential envelope points at T and T-R+1, though depending on the removal of concavities these may be the only points in Q.

To advance the envelope calculation, generator 18 successively adds new audio samples to the right end of Q, uses the Graham-scan comparison of the last two slopes on the envelope to remove any potential envelope points within Q that cause concavities with the newly added point, and drops one potential envelope point from the left end of Q to maintain the range of R. All potential envelope points dropped from the left end of Q are no longer subject to removal due to concavities, and thus become permanent envelope points, with one exception. The algorithm may generate a series of permanent envelope points that are collinear, and to save space and time all but the first and last permanent envelope points in such series are removed.

The following pseudocode describes the envelope generation process.

```
set deque Q to empty
for each sample absolute value St {
    If St is below minimum threshold, set Sn to minimum threshold.
    Add St to Q
    while more than two samples exists in Q, and
        the angle between the final two line-segments in Q is concave {
            drop the second-to-rightmost point from Q
        }
    if the range of envelope points in Q exceeds R {
        Drop the leftmost point LP from Q, adding it to the permanent envelope
        Remove from the permanent envelope any points to the left of LP that are
        collinear with LP and with the point to their left.
        Create a new generated envelope point at T-R+1 if necessary
    }
}
```

In generating envelope 20, a minimum threshold amplitude is set. Any input audio values below this threshold are assigned the minimum threshold value. This avoids attempting to bring a signal amplitude of 0 to some finite value via multiplication times Cs. E.g., a minimum threshold could be set to 1% of maximum volume. In practice, setting minimum threshold to the same value as the minimum dynamic volume works best.

Owing to the large size of audio files, they are typically broken down into segments, e.g., of 8192 bytes, and volume adjustments are computed and returned for one segment before beginning the calculations for the next segment. The envelope computation and the subsequent computations below are all implemented for one segment before starting the next segment. This necessitates a look ahead of R samples into the next segment, however, so that Q may be advanced to the point where the final time point of the current segment has been dropped from Q's left end and added to the permanent envelope.

Multiplication Factor Tunnel Generation

After the envelope has been computed, the envelope itself is used as the signal to be range-limited. Note in particular that if the envelope is kept below a certain maximum value, then the absolute value of all of the original audio samples will also be kept below that value, by the convex-hull property of the envelope.

Figure 3:
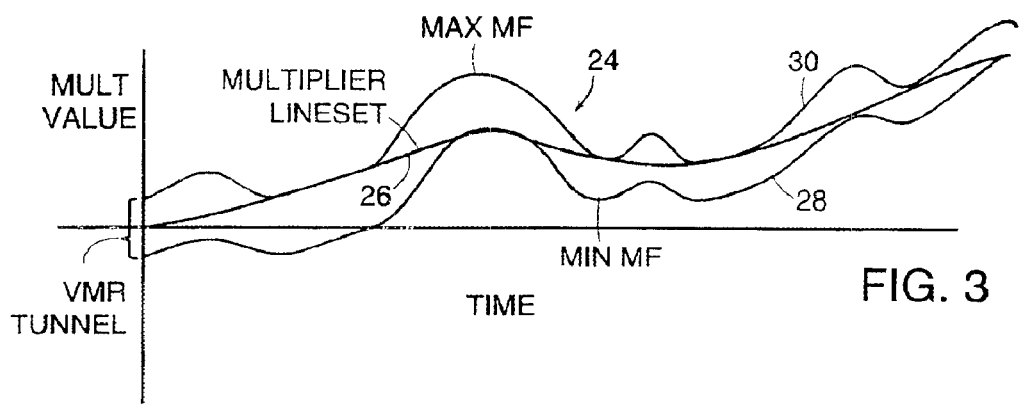
FIG. 3 is a graph of amplitude vs. time showing minimum and maximum multiplication factors for the FIG. 2 envelope and a control signal contained within the minimum and maximum multiplication factor tunnel.

Referring to FIG. 3, for every point on the envelope, there is a volume multiplication range (VMR) formed by the minimum and maximum multiplication factors (MinMF, MaxMF) that can be multiplied times the amplitude value to keep the amplitude within the permitted min/max volume range. MinMF and MaxMF are calculated by the following formulas:

MinMF=minimum permitted amplitude/envelope value

MaxMF=maximum permitted amplitude/envelope value

The MinMF and MaxMF functions 28, 30 form VMR tunnel 24 as shown on FIG. 3. For a signal that needs no adjustment, the horizontal line y=1 (or y=0 if logarithmic space is used as discussed below) will always lie within VMR tunnel 24. For signals that need amplification, the bottom of VMR tunnel 24 (the MinMF function 28) will lie above the y=1 line, and for signals that need deamplification, the top of the VMR tunnel (the MaxMF function 28) will lie below the y=1 line.

As noted above, segments of the audio file are considered in sequence; thus, in the processing of a segment of the audio file, after the MinMF and MaxMF values have been calculated for that segment, subsequent processing is performed on that segment before calculating the envelope and MinMF and MaxMF values for the next segment.

Control Signal Generation

Still referring to FIG. 3, the control signal function 26 should have the smallest possible slope to avoid conspicuous volume adjustments. While the function could include segments of straight lines kept within tunnel 24, that would result in linear volume adjustments; however, because geometric volume adjustments sound more uniform to the ear, they are preferred. To do this, the original audio points are converted to logarithmic form before envelope computation. The resultant MinMF and MaxMF data points are thus also in logarithmic form, and the logarithm of the control signal CS function 26 is generated by identifying a set of lines with the smallest slopes that fit within the logarithmic MinMF and MaxMF functions. This set of lines in logarithmic space translates to geometric or exponential curves in normal space. Note also that if the logarithms of individual CS points do not protrude above the envelope in logarithmic space, they will not protrude above the translated envelope (a series of exponential curves instead of a series of line segments) in normal space, since log is a monotonic function.

Figure 4:
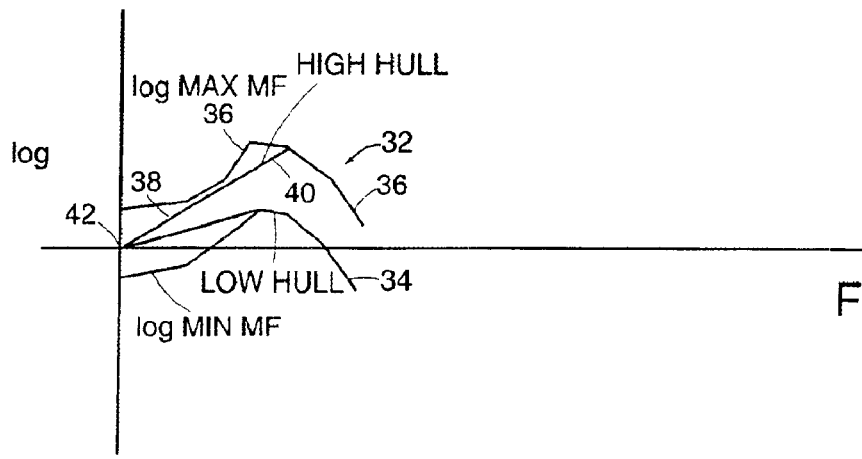
FIGS. 4–8 illustrate calculation of the FIG. 3 control signal.

Referring to FIG. 4, logarithmic-space VMR tunnel 32 has a fixed width and polygonal sides for the logarithmic MinMF function 34 and logarithmic MaxMF function 36. The vertices of log MinMF 34 and log MaxMF 36 are derived from the vertices of the signal envelope, and thus come in pairs with the same x-value. These are termed "VMR vertex pairs."

Still referring to FIG. 4, two convex hulls 38, 40, are employed, using another modification of Graham's scan (referenced earlier), to determine the logarithm of the control signal function 26. In this case, vertex pairs are considered (instead of values for each audio sample point). Also, instead of using a moving range R in which values to the left are dropped after the range passes over them, in this case the values are removed from the scan at the left each time that hulls 38, 40 cross, as described below. Hull 38 is the low hull, which is stretched across log MinMF 34; hull 40 is the high hull, which is stretched across log MaxMF 36. Both hulls 38, 40 start at a common hull base point 42, initially set to the middle of the logarithmic VMR tunnel 32, at the left hand side. The high and low points of successive VMR vertex pairs are then considered in advancing the hulls 38, 40, respectively, to the right. As each new point LP from curve 34 is added to hull 38, any points at the end of the hull that would form an upward-facing concavity with LP added are first removed. This is done by the Graham-scan approach: repeatedly examining the last two segments in hull 38 for slopes indicating an upward concavity, and if necessary removing the next-to-last point from the hull 38 to remove the concavity, until there is no upward concavity. Note that in some cases this may result in the removal of all points in hull 38 but the leftmost. When this happens, the slope of the initial segment in hull 38 increases by some amount. This is called a "narrowing" of the hull. Similarly, as each new point HP from curve 36 is added to hull 40, any points at the end of the hull that would form a downward-facing concavity with HP added are first removed. If all but the leftmost point are removed, then hull 40 is "narrowed", with the slope of its initial line segment decreasing.

As a result of this modified Graham-scan process, the first (leftmost) segment of the high hull 40 in FIG. 4 may (and almost always will) take on a lower and lower slope due to repeated narrowings. Similarly, the first segment of hull 34 takes on a higher slope with each narrowing.

Figure 5:
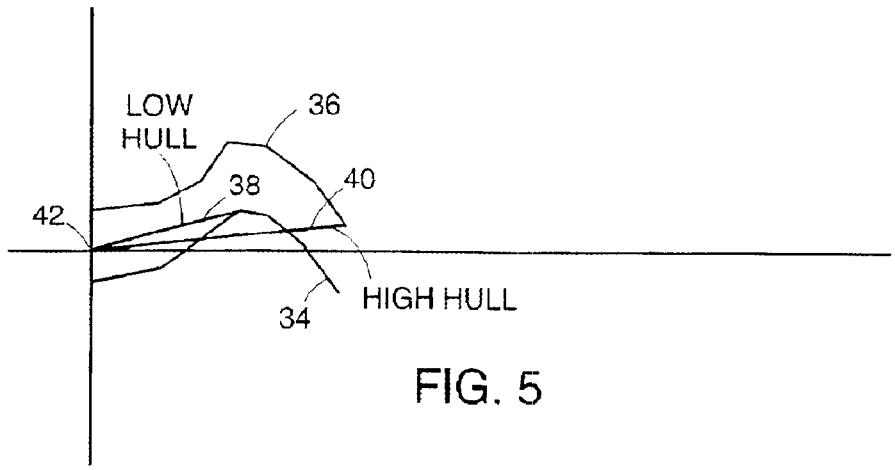
Figure 6:
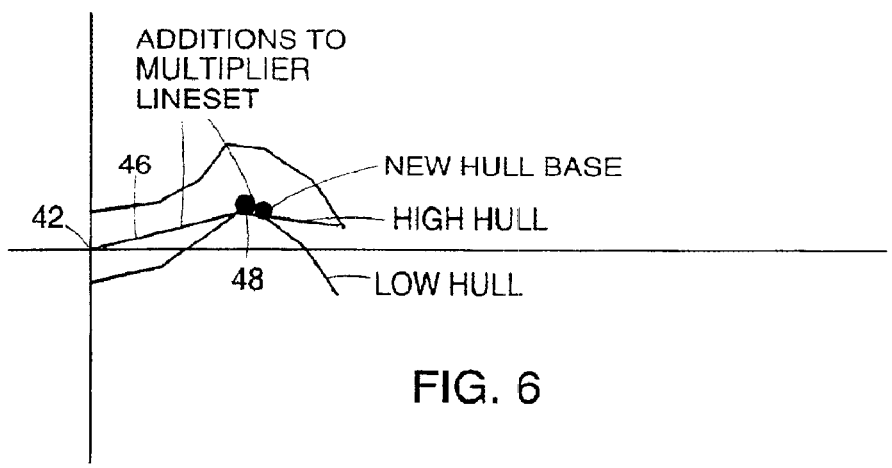

After some number of narrowings, the first segment of the low hull will have higher slope than the first segment of the high hull. This is considered a "hull crossing." E.g., FIG. 5 shows the high hull's first segment having a lower slope than the low hull's first segment. When the hulls cross, one, and only one, of the hulls has a single segment directly from the hull base to the high or low vertex of the just-added VMR vertex pair; this hull is considered the simple hull. The other hull must have more than one segment, and is considered the compound hull. When the hulls cross, the leftmost segment of the compound hull is designated as a permanent segment of the log control signal function 46 (FIG. 6; the log of control signal function 26), and is removed from consideration in the ongoing advancement to the right. The end of this segment becomes the new hull base point 48 of both hulls, and changes the starting point of the first segment of the simple hull and the compound hull, as is shown in FIG. 6 If the hulls still cross after this adjustment, we repeat the same adjustment, removing further leftmost segments from the compound hull and adding the removed segments to the log control signal function 46, until the hulls no longer cross. This must happen before all segments are exhausted from the compound hull, since if each hull has only one segment remaining, those segments must lead from the hulls' common base point to the high and low points of the most-recently added VMR vertex pair, and the hulls do not cross. Addition of VMR vertex pairs to the hulls continues, with new additions to the log control signal function 46 occurring each time the hulls cross. At each point in the process, there are completed segments of the log control signal function 46 up to (to the left of) the new hull base 48, non-crossing low and high hulls 38, 40 to the right of the new hull base 48 and to the left of the most-recently added VMR vertex pair, and unexplored areas of the logarithmic VMR tunnel 32 to the right of the most-recently added VMR vertex pair.

Figure 7:
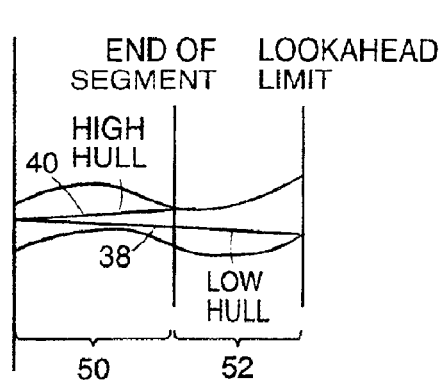
Figure 8:
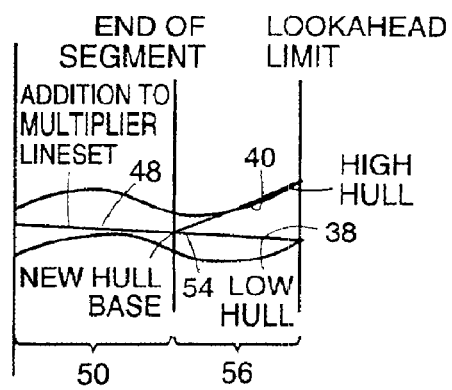

As noted above, audio files are typically broken down into segments, using a limited look ahead at the data beyond the end of the current segment. In processing by segments, the values of log control signal function 46 must be computed for the current segment, even if the look ahead data is not sufficient to cause hull crossings that would generate the values for log control signal 46 in the normal way. When the full look ahead for a given segment has been used without obtaining values for log control signal function 46 that cover the entire segment, the processing is in an "indeterminate slope state" such as illustrated in FIG. 7. As shown in FIG. 7, high hull 40 and low hull 38 do not cross in either current segment 50 or look ahead segment 52. To resolve an indeterminate slope state, a slope between the first segments of the high and low hulls is selected for log control signal 46 for the current segment 50, as shown in FIG. 8. The slope may be selected to force the log multiplier back to 0 as much as possible, or it may be selected to minimize the slope of log control signal function 46. The ending point 54 of the line of the selected slope becomes the new hull base for the next segment 56.

This process produces a log control signal function 46 with the smallest overall slope while still staying within the log VMR tunnel 32 (with the possible exception of slopes chosen to resolve indeterminate slope states between audio segments). The order of complexity of this process is O(n), with n being the number of envelope vertices. In the hull computations, each point is processed at most twice—once to be added to the hull, and to be removed. The per-point processing thus takes an amount of time independent of the number of points overall. The O(n) complexity of the described algorithm results in very fast execution.

Once the full logarithmic control signal function 46 has been computed for all audio segments, the antilog of the y-value of the log control signal function is taken at each audio sample point (each x point) to obtain the values in control signal function 26 of the control signal Cs for each audio sample. Respective values of Cs are then multiplied times the audio input signal values, resulting in an output signal with minimal, geometric, volume adjustments that maintain an amplitude within the specified range. In multiplying the Cs values times the input audio values, input audio values below the threshold mentioned earlier are assigned to the minimum threshold value to avoid attempting to bring a signal amplitude of 0 to some finite value via multiplication times Cs. The original audio data, however, is not changed. Best results are obtained by using the same value for the minimum amplitude and the threshold. This prevents spurious amplification of very-quiet signals that lie between the minimum amplitude and the threshold.

A stored audio program can be accessed and processed by generator 18 and unit 10 and then stored in dynamically range-compressed form. Audio programs being input or output from audio equipment can also be dynamically range compressed on the fly, e.g., in video or audio streaming applications or in the creation of compressed video or audio programs.

Other embodiments of the invention are within the scope of the following claims:

What is claimed is:

1. A computer processor method of creating an audio multiplier control signal for controlling the dynamic range of recorded audio work including an audio signal having an amplitude that varies over the time period of the work, said method comprising receiving amplitude versus time values for said audio signal, determining an envelope of the amplitude of said audio signal using a convex hull calculation, determining, for values of said envelope, respective minimum and maximum multiplication factors (MinMF and MaxMF) that can be multiplied times said values such that the products are above a predetermined minimum amplitude and below a predetermined maximum amplitude of said dynamic range, and creating a control signal function of amplitude versus time such that all values of said control signal function at particular times are between respective MinMF and MaxMF values for said times, and such that segments of said control signal function have reduced slopes.

2. The method of claim 1 wherein said audio signals include digital audio samples.

3. The method of claim 2 wherein said determining an envelope includes using a convex hull calculation.

4. The method of claim 1 wherein said determining an envelope includes determining an envelope for the absolute values of the amplitude of said audio signal.

5. The method of claim 1 wherein said using a convex hull calculation involves traversing said amplitude versus time values with a moving range of data points.

6. The method of claim 5 wherein said range is greater than or equal to the longest wavelength of said audio signals.

7. The method of claim 6 wherein said range is 750 samples or greater for a signal having a sampling rate of 44 KHz and a longest wavelength of 1/30 second.

8. The method of claim 5 wherein data points on the trailing side of said range are dropped as the trailing edge of said range traverses said data points.

9. The method of claim 8 wherein data points within said range are popped as they fall below the envelope being extended to data points at the leading edge of said range.

10. The method of claim 1 wherein said creating a control signal function includes using a first convex hull calculation for said MinMF values and a second convex hull calculation for said MaxMF values to identify line segments of said control signal function that are between said MinMF and MaxMF values and have reduced slope.

11. The method of claim 10 wherein said MinMF and MaxMF values are converted to logarithms prior to using said first and second convex hull calculations.

12. The method of claim 10 wherein said first convex hull calculation results in a low hull, and said second convex hull calculation results in a high hull, and a segment of the control signal function is determined each time that the low hull and high hull cross.

13. The method of claim 1 wherein said creating a control signal function includes using logarithms of said MinMF values and said MaxMF values and generating segments of a logarithm of said control signal function such that values of said logarithm of said control signal function are between said logarithm of MinMF and logarithm of MaxMF values, and such that segments of said logarithm of said control signal function have reduced slopes.

14. The method of claim 13 wherein said envelope has vertices, and said creating a control signal function has an order of complexity of O(n), where n is the number of envelope vertices.

15. The method of claim 1 wherein said determining the envelope of the amplitude of said audio signal has an order of complexity of O(n), where n is the number of audio signal values.

16. The method of claim 1 wherein said envelope has vertices, and said creating a control signal function has an order of complexity of O(n), where n is the number of envelope vertices.

17. The method of claim 1 wherein each said amplitude value for said audio signal is examined at most a fixed number of times in said determining the envelope of the amplitude of said audio signal.

18. The method of claim 1 wherein said envelope has vertices, and each said vertex is examined at most a fixed number of times independent of the control signal lookahead in said creating a control signal function.

19. The method of claim 1 wherein amplitude values below a minimum threshold value are taken as said minimum threshold value in said determining the envelope.

20. A computer processor method of controlling the dynamic range of an audio work including an audio signal having an amplitude that varies over the time period of the work, said method comprising receiving amplitude versus time values for said audio signal, determining an envelope of the amplitude of said audio signal using a convex hull calculation, determining, for values of said envelope, respective minimum and maximum multiplication factors (MinMF and MaxMF) that can be multiplied times said values such that the products are above a predetermined maximum of said dynamic range, creating a control signal function of amplitude versus time such that all values of said control signal function at particular times are between respective MinMF and MaxMF values for said times and segments of said control signal function have reduced slopes, using said control signal function to generate multiplication factors for respective times in said audio work, and multiplying said audio signal values by respective said multiplication factors.

21. The method of claim 20 wherein said using a convex hull calculation involves traversing said amplitude versus time values with a moving range of data points.

22. The method of claim 21 wherein data points on the trailing side of said range are dropped as the trailing edge of said range traverses said data points.

23. The method of claim 22 wherein data points within said range are popped as they fall below the envelope being extended to data points at the leading edge of said range.

24. The method of claim 20 wherein said creating a control signal function includes using a first convex hull calculation for said MinMF values and a second convex hull calculation for said MaxMF values to identify segments of said control signal function that are between said MinMF and MaxMF values and have reduced slope.

25. The method of claim 24 wherein said MinMF and MaxMF values are converted to logarithms prior to using said first and second convex hull calculations.

26. The method of claim 25 wherein said first convex hull calculation results in a low hull, and said second convex hull calculation results in a high hull, and a segment of the control signal function is determined each time that the low hull and high hull cross.

27. The method of claim 26 wherein said creating a control signal function includes using logarithms of said MinMF values and said MaxMF values and generating segments of a logarithm of said control signal function such that values of said logarithm of said control signal function are between said logarithm of MinMF values and said logarithm of MaxMF values, and segments of said logarithm of said control signal function have reduced slopes.

28. The method of claim 20 wherein amplitude values below a minimum threshold value are taken as said minimum threshold value is said determining the envelope.

29. Electronic apparatus for creating an audio multiplier control signal for controlling the dynamic range of a recorded audio work including an audio signal having an amplitude that varies over the time period of the work, said apparatus comprising an input to receive amplitude versus time values for said audio signal, a processor that determines an envelope of the amplitude of said audio signal using a convex hull calculation and determines, for values of said envelope, respective minimum and maximum multiplication factors (MinMF and MaxMF) that can be multiplied times said values such that the products are above a predetermined minimum amplitude and below a predetermined maximum amplitude of said dynamic range, creating a control signal function of amplitude versus time such that all values of said control signal function at particular times are between respective MinMF and MaxMF values for said times and such that segments of said control signal function have reduced slopes, and an output for outputting values of said control signal function.

30. The apparatus of claim 29 wherein said processor is adapted to use a convex hull calculation by traversing said amplitude versus time values with a moving range of data points.

31. The apparatus of claim 30 wherein said processor is adapted to drop data points on the trailing side of said range as the trailing edge of said range traverses said data points.

32. The apparatus of claim 31 wherein said processor is adapted to pop data points within said range as they fall below the envelope being extended to data points at the leading edge of said range.

33. The apparatus of claim 29 wherein said processor is adapted to create said control signal function using a first convex hull calculation for said MinMF values and a second convex hull calculation for said MaxMF values to identify segments of said control signal function that are between said MinMF and MaxMF values and have reduced slope.

34. The apparatus of claim 33 wherein said processor is adapted to convert said MinMF and MaxMF values to logarithms prior to using said first and second convex hull calculations.

35. The apparatus of claim 29 wherein said first convex hull calculation results in a low hull, and said second convex hull calculation results in a high hull, and said processor is adapted to determine a segment of the control signal function each time that the low hull and high hull cross.

36. The apparatus of claim 29 wherein said processor is adapted to create a control signal function by using logarithms of said MinMF values and said MaxMF values and generating segments of a logarithm of said control signal function such that values of said logarithm of said control signal function are between said logarithm of MinMF and logarithm of MaxMF values, and segments of said logarithm of said control signal function have reduced slopes.

37. The apparatus of claim 29 wherein said processor is adapted to replace amplitude values below a minimum threshold value with said minimum threshold value in determining the envelope.

38. A computer processor method of creating a reduced-slope series of line segments passing through a pair of Max and Min limiting functions specifying y values with respect to a variable x, said method comprising defining said Max and Min limiting functions, and using a first convex hull calculation for y values of said Min limiting function and a second convex hull calculation for y values of said Max limiting function to identify line segments that are between said Min and Max values and have reduced slope.

39. The method of claim 38 wherein said Min and Max y values are converted to logarithms prior to using said first and second convex hull calculations.

40. The method of claim 39 wherein said first convex hull calculation results in a low hull, and said second convex hull calculation results in a high hull, and a said segment of said reduced slope series of line segments is determined each time that the low hull and high hull cross.

41. The method of claim 38 wherein said defining said Max and Min limiting functions includes using logarithms of y values generated by said Min and said Max limiting functions, and said using first and second convex hull calculations involves identifying line segments between said logarithm of Min and logarithm of Max values such that said segments have reduced slopes.

* * * * *